(12) United States Patent
Block et al.

(10) Patent No.: US 6,737,728 B1
(45) Date of Patent: May 18, 2004

(54) ON-CHIP DECOUPLING CAPACITOR AND METHOD OF MAKING SAME

(75) Inventors: Bruce A. Block, Portland, OR (US); Richard Scott List, Beaverton, OR (US); Ruitao Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/687,906

(22) Filed: Oct. 12, 2000

(51) Int. Cl.[7] .................. H01L 27/108; H01L 29/76; H01L 29/94; H01L 31/119; H01L 29/00
(52) U.S. Cl. ........................ 257/532; 257/296
(58) Field of Search ................. 257/295–310, 257/530–535; 438/3, 253–254, 396–398

(56) References Cited

U.S. PATENT DOCUMENTS 5,972,722 A * 10/1999 Visokay et al. ............ 438/240
6,090,697 A * 7/2000 Xing et al. ................. 438/253
6,211,035 B1 * 4/2001 Moise et al. ............... 438/396

* cited by examiner

*Primary Examiner*—Cuong Nguyen
(74) *Attorney, Agent, or Firm*—Blakely, Sokoloff, Taylor & Zafman LLP

(57) ABSTRACT

On-chip decoupling capacitor structures, and methods of fabricating such decoupling capacitors are disclosed. In one embodiment of the present invention, a capacitor stack may consist of a bottom electrode/barrier; a thin dielectric material having a high dielectric constant; and a top electrode/barrier. In an alternative embodiment, the bottom electrode and/or bottom metal interconnect layer have three dimensional texture to increase the surface area of the capacitor. An illustrative method embodying the present invention, includes fabricating the on-chip decoupling capacitor stack structure and electrically connecting the capacitor to provide efficient capacitive de-coupling.

12 Claims, 13 Drawing Sheets

US 6,737,728 B1

ON-CHIP DECOUPLING CAPACITOR AND METHOD OF MAKING SAME

BACKGROUND OF THE INVENTION

FIELD OF THE INVENTION

The invention relates generally to integrated circuits, and more particularly to the formation of interlayer decoupling capacitors.

BACKGROUND

Advances in semiconductor manufacturing technology have led to the integration of tens, and more recently hundreds, of millions of circuit elements, such as transistors, on a single integrated circuit (IC). To achieve such dramatic increases in the density of circuit components has required semiconductor manufacturers to scale down the size of the circuit elements and the interconnection structures used to connect the circuit elements into functional circuitry, as well as scaling down the spacing between the interconnect.

When transistors in these high density integrated circuits demand high current at high frequencies, there can be both global and localized voltage drops on the power grid of the IC. This voltage drop can be reduced by providing localized sources of current, such as capacitors, which de-couple current surges from the power grid, and thereby reduce noise on the power grid. Conventionally, de-coupling capacitance in electronic systems that include ICs on printed circuit boards has been accomplished in two main ways. Firstly, through the use of off-chip capacitors which are located nearby on the printed circuit board, or incorporated into the package of the integrated circuit, and secondly, with the on-chip capacitors formed from the very thin gate dielectric layers found in MOS integrated circuits. The off-chip capacitor configuration includes parasitic inductance arising from the length of the wiring needed to connect the off-chip capacitors with the IC, which in turn limits its effectiveness for high frequency noise. The off-chip capacitors also provide little or no benefits for localized voltage droops. Additionally, extra manufacturing cost is associated with products using this approach because a separate discrete component is used. With respect to the capacitors formed with gate dielectric layers, these provide limited capacitive de-coupling due to the small area fraction of the chip that can be cost-effectively dedicated to decoupling capacitors. The limited area constrains the magnitude of the capacitance that can be achieved. In addition these gate dielectric capacitors have leakage currents which contribute to unacceptable power consumption.

What is needed are area-efficient decoupling capacitors having reduced parasitic inductances, and methods of the making these.

DETAILED DESCRIPTION

Terminology

Figure 1:
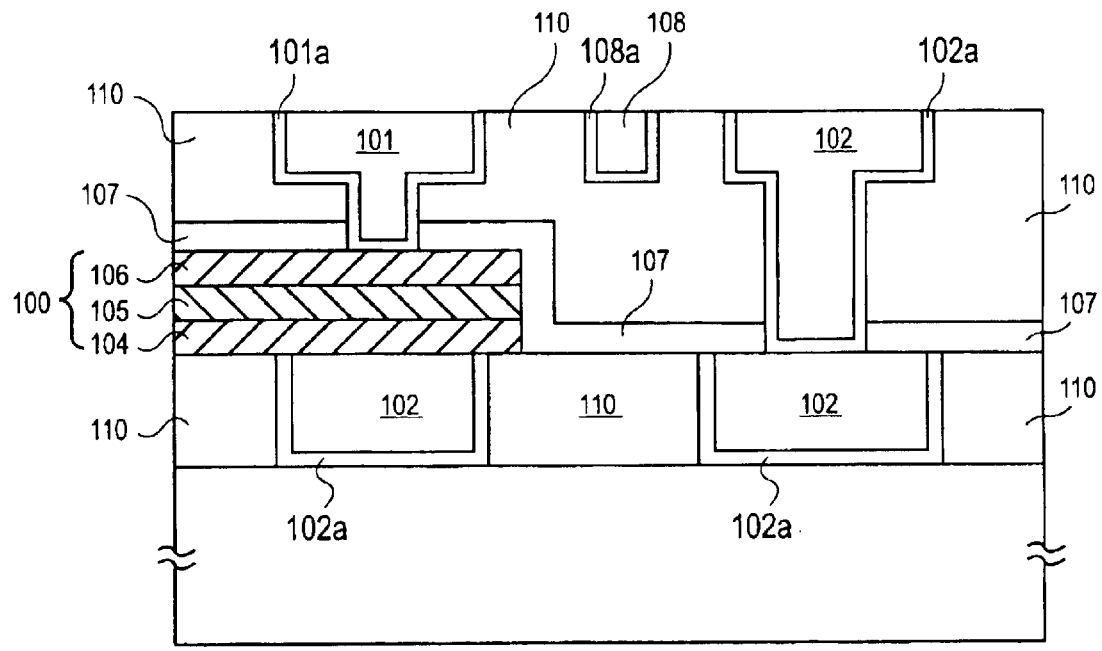
FIG. 1 is a schematic cross section of a portion of a wafer showing two levels of copper interconnects and a capacitor disposed between a first interconnect line and a via.

The terms, chip, integrated circuit, monolithic device, semiconductor device, and microelectronic device, are often used interchangeably in this field. The present invention is applicable to all the above as they are generally understood in the field.

BST refers to barium strontium titinate.

The expression, low dielectric constant material, refers to materials having a lower dielectric constant than silicon dioxide. For example, organic polymers, amorphous fluorinated carbons, nanofoams, silicon based insulators containing organic polymers, and both fluorine-doped and carbon-doped oxides of silicon have lower dielectric constants than silicon dioxide.

The letter k, is often used to refer to dielectric constant. Similarly, the terms high-k, and low-k, are used in this field to refer to high dielectric constant and low dielectric constant respectively, where high means greater than the dielectric constant of silicon dioxide, and low means lower than the dielectric constant of silicon dioxide.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect, interconnect lines, or simply metal. Metal lines, such as aluminum (Al), copper (Cu), an alloy of Al and Cu, an alloy of Al, Cu and silicon (Si), tungsten (W), and nickel (Ni) are conductors that provide signal paths for coupling, or interconnecting, electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion, ion implantation, or source gas mix in an epitaxial growth or selective silicon deposition), titanium (Ti), molybdenum (Mo), and refractory metal silicides are examples of other conductors. Those skilled in the art will recognize that the foregoing is an exemplary, and not an exhaustive, list of conductive materials.

Briefly, on-chip decoupling capacitor structures, and methods of fabricating such decoupling capacitors are disclosed. On-chip decoupling capacitors help to reduce or prevent voltage droop on the power grid for high surge current conditions (V=L di/dt). The inclusion of one or more decoupling capacitors on a chip, directly between the power grid conductors reduces the parasitic inductance found in conventional solutions, and thereby provides improved decoupling performance with respect to high frequency noise.

Reference herein to "one embodiment", "an embodiment", or similar formulations, means that a particular feature, structure, or characteristic described in connection with the embodiment is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

In one embodiment of the present invention, a capacitor stack structure is formed between metal interconnect layers during the back-end of a semiconductor manufacturing process. Such a capacitor stack may consist of a bottom electrode/barrier, a thin dielectric material having a high dielectric constant, and a top electrode/barrier.

An illustrative method embodying the present invention, includes fabricating the on-chip decoupling capacitor stack structure and electrically connecting the capacitor to copper interconnect lines to provide efficient capacitive de-coupling. In order to facilitate the removal of photoresist by an oxygen plasma process prior to exposing Cu during the capacitor stack etch, an Al hardmask can be used to protect the capacitor formed with $Ta_2O_5$ dielectric, or a W hardmask can be used to protect the capacitor formed with BST dielectric.

In another embodiment of the present invention, a three dimensional bottom electrode is formed to increase the area, and therefore the capacitance, of the capacitor. The non-planarity that gives the increased surface area of the capacitor per unit area of the chip on which the capacitor is fabricated can be achieved in several ways. Methods of obtaining the non-planar capacitor include, but are not limited to, deposition and high aspect ratio patterning of a dielectric layer under the bottom electrode, deposition of a rough bottom electrode, surface modification of the bottom electrode to provide increased surface area, and surface modification of the Cu to provide increased surface area. A low cost approach to implementing the 3-D template uses the via mask to simultaneously pattern the 3-D template for the capacitor. That is, in a damascene metallization scheme, the via openings and the 3-D template are formed by the same set of operations.

In another aspect of the present invention, in order to reduce the risk of conductive re-deposition on the sidewalls of the etched stack, it is desirable to not have to etch through the bottom electrode. This can be accomplished by selectively depositing a bottom electrode on Cu metal surface through selective electro-less plating of the conducting bottom electrode.

Structure

Figure 2:
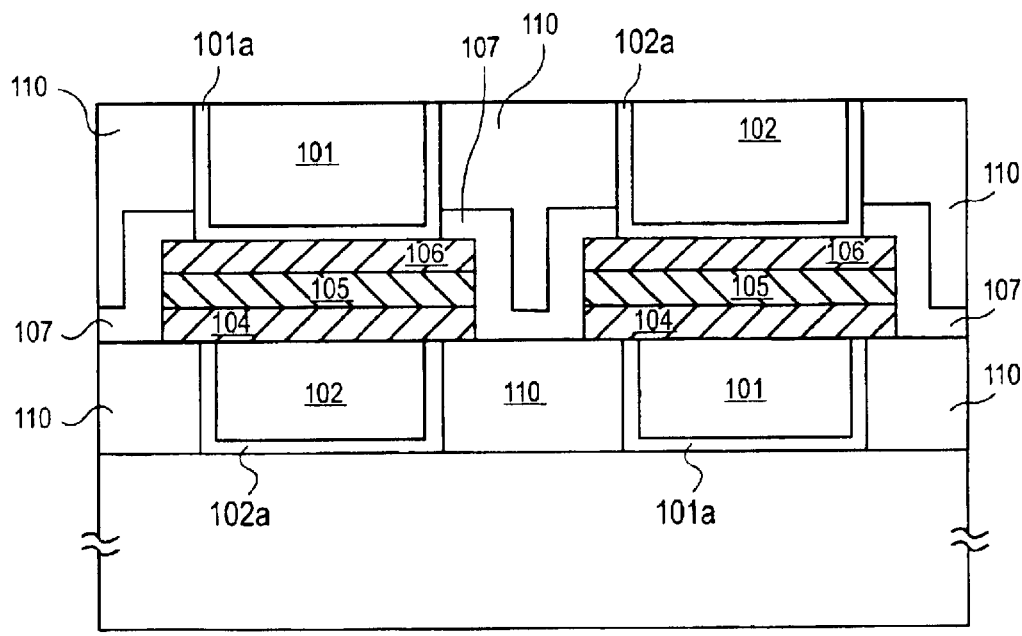
FIG. 2 is a schematic cross section of a portion of a wafer showing two levels of copper interconnects and a capacitor disposed between the interconnects of the two levels.

As shown in FIG. 1, an illustrative embodiment of the invention includes a capacitor stack 100 disposed between metal layers which form chip interconnections. Typically, but not always, these chip interconnections are part of the power delivery network of the chip. In the illustrative embodiment, the chip interconnections are made of damascene copper lines formed in trenches etched into dielectric layers 110. Capacitor stack 100 may be disposed between power 101, and ground 102 conductors and may also be disposed in the vicinity of signal conductors 108 Alternatively, capacitor stack 100 (or more simply capacitor 100), can be disposed between dedicated power and ground layers as illustrated in FIG. 2. In typical embodiments of the present invention, capacitor 100 includes a bottom electrode 104 which may also serve as a copper diffusion barrier, a high-k dielectric layer 105, and a top electrode 106 which, like bottom electrode 104, may also serve as a copper diffusion barrier. One "plate" or electrode of capacitor stack 100 is electrically connected to ground 102 and the other electrode is connected to power 101. Those skilled in this art will recognize that in the literature of this field, ground is sometimes referred to as Vss, and power is sometimes referred to as Vcc. The present invention is not limited in any way by the labels attached to such electrical nodes, nor is it limited by the use of any particular range of voltages applied to its electrodes. The capacitor electrodes may also be referred to as terminals.

A barrier layer of silicon nitride 107 is disposed over capacitor stack 100. Silicon nitride layer 107 is a barrier to the diffusion of copper. Layer 107 may be used as an etch stop layer during the manufacturing process. Electrically insulating materials other than silicon nitride may be used as a barrier to prevent copper diffusion in alternative embodiments of the present invention.

Capacitor stack 100 is disposed in close proximity to, or preferably directly on the copper interconnects to make electrical contact to bottom electrode 104. Cu is deposited over top electrode 106 of capacitor stack 100. Preferably, the capacitor is located close to the power and ground nodes (or whichever nodes are being decoupled) to reduce the parasitic inductance.

Figure 3:
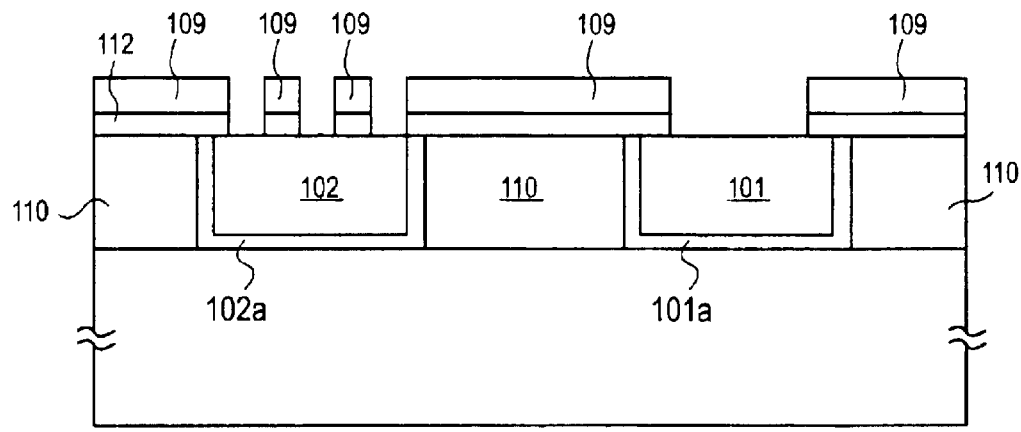
FIG. 3 is a schematic cross section of a portion of a partially processed wafer showing patterned dielectric material over copper metal.
Figure 4:
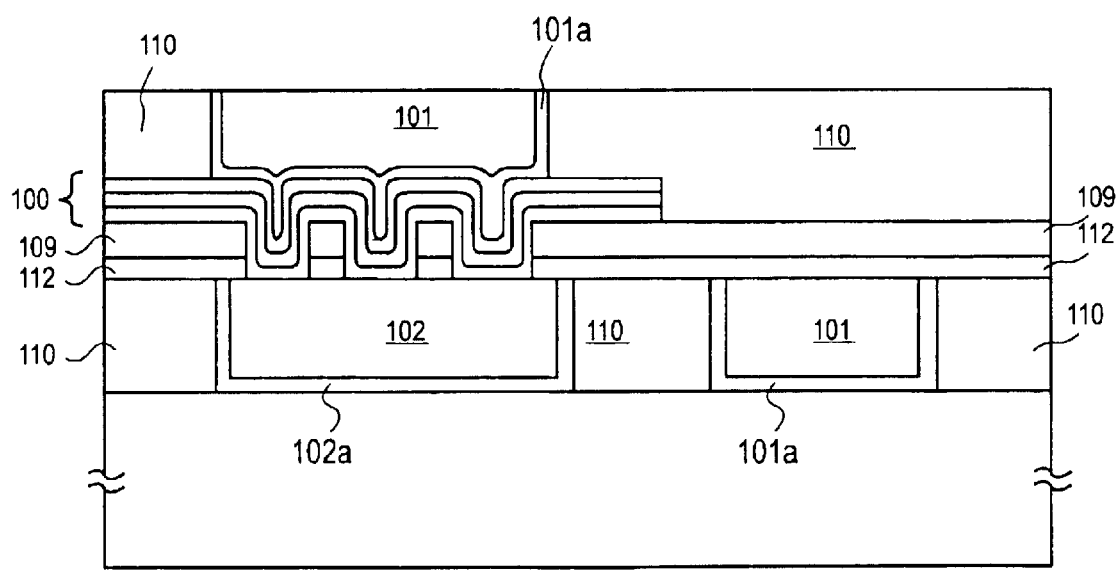
FIG. 4 is a schematic cross section of a capacitor in accordance with the present invention.

In one embodiment of the present invention, as shown in FIGS. 3 and 4, a patterned dielectric layer 109 approximately 0.5–1 micron thick is disposed under the capacitor stack. Patterned dielectric layer 109 has high aspect ratio openings therein to provide a three dimensional (3-D) template for increased area of the capacitor and thereby provide a corresponding increase in capacitance. FIG. 3 shows details of the 3D dielectric template (i.e., patterned dielectric layer) 109 used to facilitate the increase in capacitor area. FIG. 4 shows a completed structure including capacitor stack 100 having a bottom electrode in contact with Vss metal 102, and a top electrode in contact with a barrier layer 101a of Vcc metal 101. copper diffusion barrier 112 underlies patterned dielectric layer 109. Barrier layers 101a, 102a are typically made of materials such as tantalum or tantalum nitride.

Figure 5:
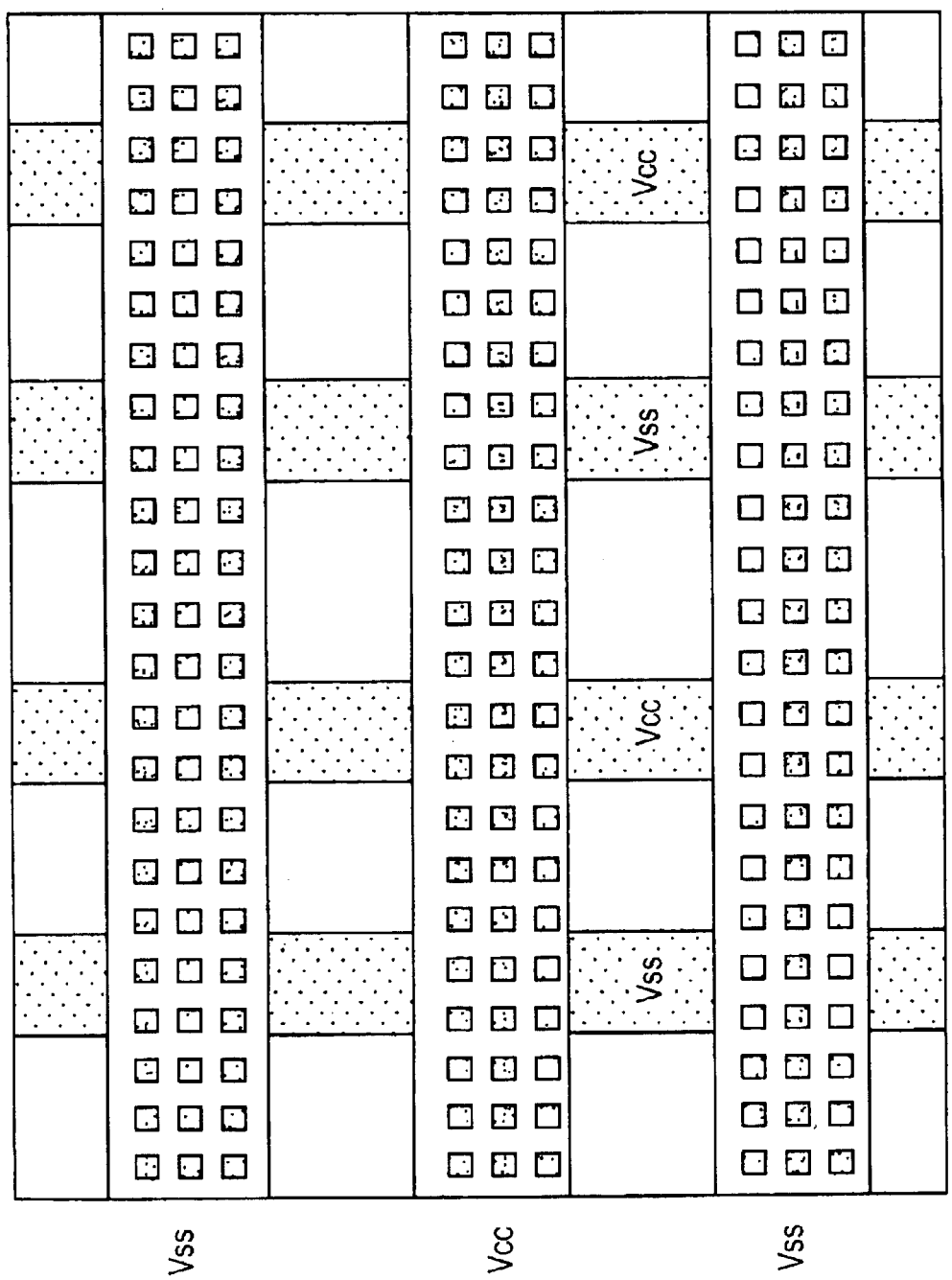
FIG. 5 is a top view of a portion of an integrated circuit having capacitors in accordance with the present invention disposed between power and ground nodes.

A top view of the physical layout of an IC including decoupling capacitors in accordance with the present invention is shown in FIG. 5.

Figure 6:
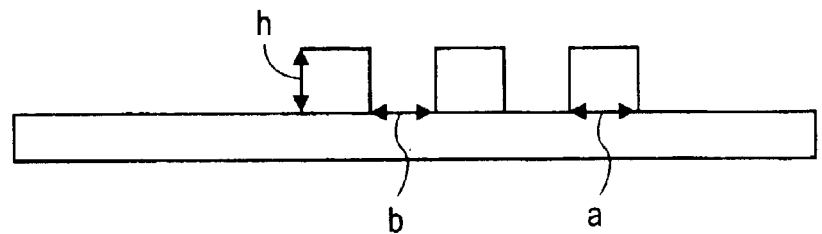
FIG. 6 is a diagram identifying the various parameters involved in determining the improvement in capacitance offered by embodiments of the present invention.

The increase in capacitance, Delta, which is due to the application of 3-D texturing to increase the area between electrodes, can be estimated by the following equation:

$$\text{Delta} = [(a*h) + a^2]/(a^2)$$

Where h, a, and b are as defined in FIG. 6. The equation is based on the assumption that the capacitor stack has thickness $\ll h$, a and b. For h=0.75 microns and a=b=0.25 microns, the area increase provided by the 3-D template is 4× the area compared to a planar capacitor. Since the capacitance is directly proportional to area, the 4× increase in area would be equivalent to a 4× increase in capacitance.

Figure 7:
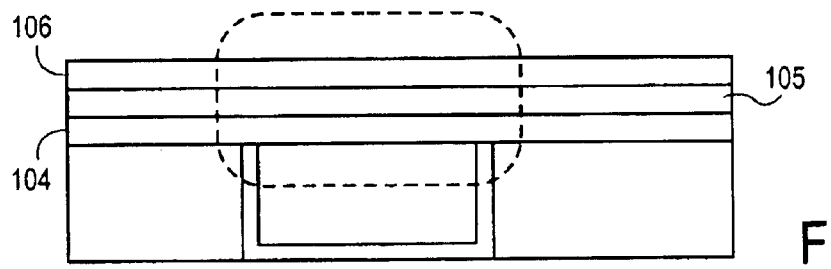
FIG. 7 is a schematic cross section of a capacitor in accordance with the present invention.
Figure 8:
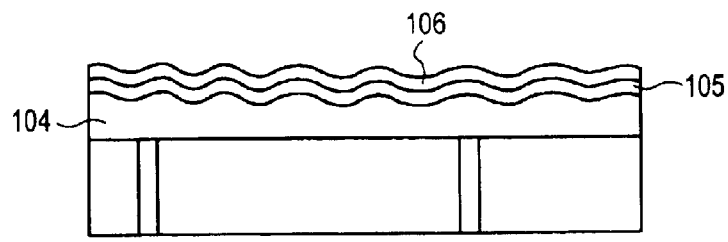
FIG. 8 is an enlarged view of FIG. 7 illustrating a roughened surface for increasing the area, and therefore the capacitance, of the capacitor.
Figure 9:
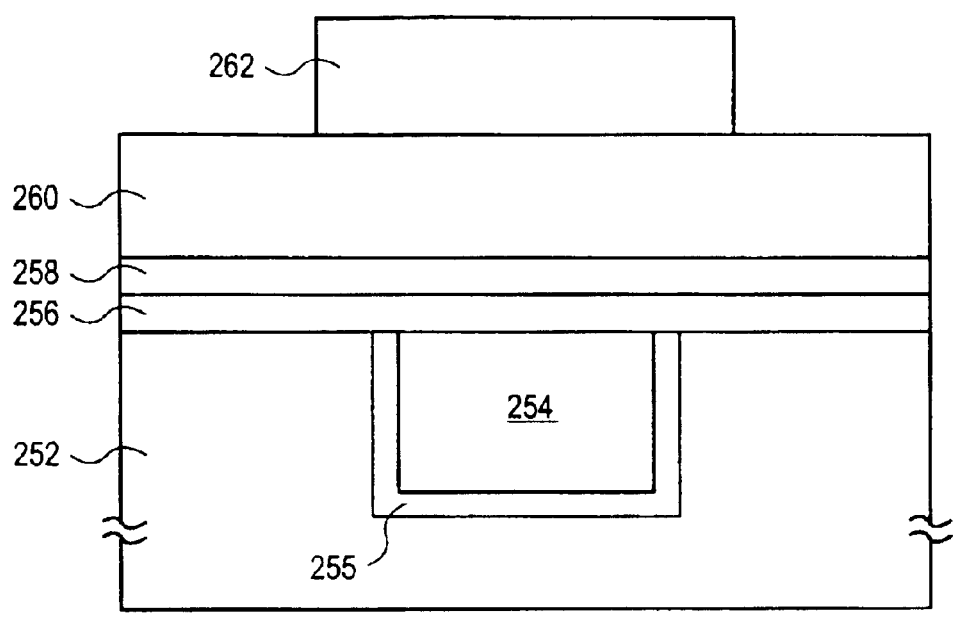
FIG. 9 is a schematic cross section of a partially processed wafer having a layer of patterned photoresist superjacent the top electrode of a capacitor stack.
Figure 10:
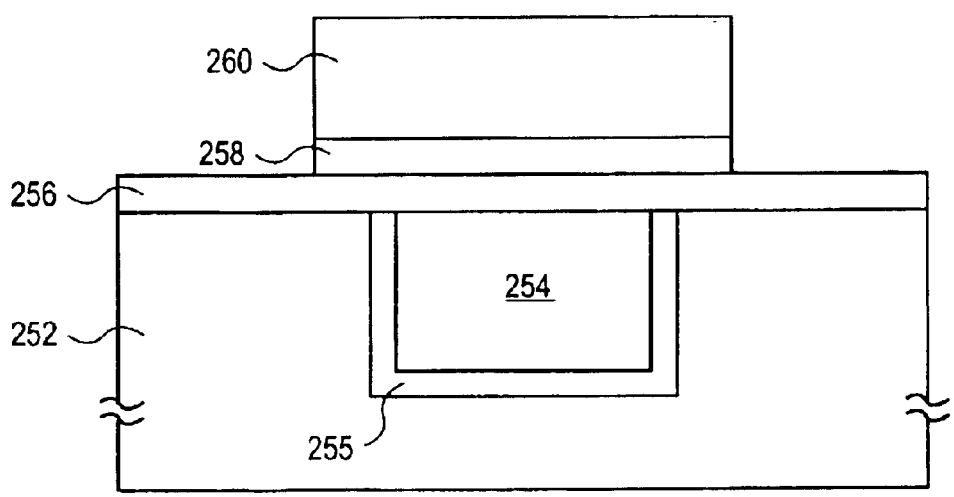
FIG. 10 is a schematic cross section of the structure of FIG. 9 after the top electrode and underlying dielectric layer have been etched, and the patterned photoresist has been removed.
Figure 11:
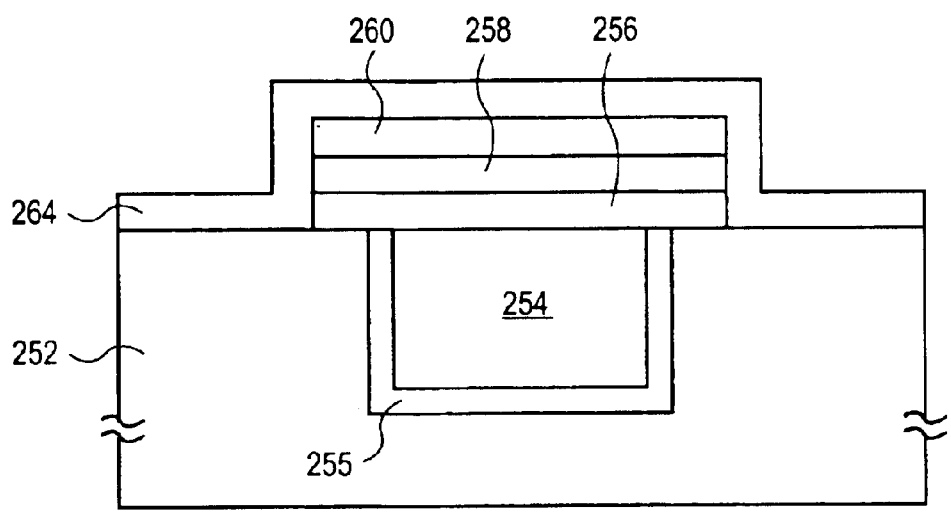
FIG. 11 is a schematic cross section of the structure of FIG. 10 after the bottom electrode has been etched, and a patterned barrier layer has been formed adjacent to the vertical sides of the capacitor stack.

An alternative embodiment is shown in FIGS. 7–8, wherein an increases in a capacitor area, as compared to a planar capacitor, includes a bottom electrode 104 having surface roughness on the same order as the dielectric film stack in order to increase the capacitor area. More particularly, FIG. 7 shows a capacitor stack over a copper interconnect layer, while FIG. 8 shows a magnified view of that portion of FIG. 7 shown within the dashed lines. The surface roughness that provides for the increased capacitor area can be seen in FIG. 8. This surface roughness can be accomplished by depositing a polycrystalline film of TiN or TaN as the bottom electrode and then selectively etching the grain boundary with a wet chemical etch which selectively attacks the grain boundaries. Alternatively, the deposition parameters can be adjusted to provide a film with sufficient roughness. For example, the deposition parameters may be tuned to produce columnar grains. These columnar grains may provide a template for the 3D surface which can then be enhanced by selectively etching the grain boundaries. Buffered hydrofluoric acid can be used such that the etch rate at the grain boundaries than at the interior of the grains, thereby providing a series of "grooves" in the surface.

The dielectric material selected for use in the present invention should have a high-k value, low leakage current and low loss at high frequencies. High-k dielectric materials such as BST and $Ta_2O_5$ are the presently preferred materials but the invention is not limited to these materials. Since high-k dielectric films are generally formed in an oxidizing atmosphere, it is necessary to prevent the oxidation of Cu interconnects when these are used in embodiments of the present invention. This can be accomplished by having capacitor electrodes that also act as an oxygen barrier. In the case of BST dielectric films, the electrodes should be made of metals which do not oxidize, or if they do oxidize, the resulting oxide should be conductive. Pt, Ru, and Ir are examples of materials with the required properties for making the capacitor electrodes separated by BST.

In the situation where the capacitor electrodes are permeable to oxygen, a separate conductive barrier material disposed between the electrode and the dielectric layer is desirable to prevent oxygen from reaching the Cu. The oxygen barrier material should preferably be conductive. TiN and TaN possess preferred characteristics for barrier materials in accordance with the present invention. Electrode material that is not permeable to oxygen could also act as an oxygen barrier to the Cu. When $Ta_2O_5$ is used as the dielectric material, TaN, TiN or WN may be used as electrode material since they are conductive and act as an oxygen barrier and as a Cu diffusion barrier.

Process

Incorporating the formation of a capacitor stack in accordance with the present invention, into the backend interconnect process requires consideration of how to not increase unnecessarily the number of masks and process operations in order to provide low manufacturing costs. In order to reduce the number of masks, the etch through the entire capacitor stack should be completed with a single mask. In one process embodying the present invention, shown in FIGS. 9–12, a thick top electrode 260 is used to facilitate a reduced number of masks. In this embodiment, patterned photoresist 262 is used to define top electrode 260 with a timed etch. Photoresist 262 is then removed with an $O_2$ ashing operation. During the $O_2$ ashing operation, Cu metal 254 is protected under the blanket layer of bottom barrier/electrode 256 and high-k dielectric 258. After removal of photoresist 262, etching is performed until the bottom electrode is defined. Another way to protect underlying Cu 254 is to use a Cu inert chemical to strip the photoresist after etching through the capacitor stack.

Referring now to FIGS. 9–12, an exemplary process embodying the present invention and having copper interconnects and $Ta_2O_5$ as the dielectric material of the decoupling capacitor is described. A bottom electrode 256 is formed over a planarized Cu 254 and ILD 252 surface (i.e., the post-polish surface of a damascene interconnect layer, sometimes referred to as in-laid conductors). Bottom electrode 256 is typically formed by a deposition process in which a conductive barrier material such as, for example, TaN, TiN, or WN, is deposited over the surface. Such as deposition may be referred to a blanket deposition. By acting as a barrier, bottom electrode 256 substantially or completely prevents both oxidation of underlying copper 254, and diffusion of copper through bottom electrode 256 into the surrounding ILD during subsequent processing operations. It is preferable that the material which forms the bottom electrode not oxidize during a subsequent high temperature operation, such as the deposition of a high-k dielectric material. Bottom electrode 256 may be formed from two or more layers of different materials to achieve the desired characteristics.

After bottom electrode 256 is formed, a high-k dielectric layer 258 is formed superjacent bottom electrode 256. In this illustrative embodiment of the present invention, high-k dielectric layer 258 is $Ta_2O_5$.

A top electrode 260 is then formed superjacent high-k dielectric layer 258. Top electrode 260 is typically formed by a deposition process in which a conductive barrier material such as, for example, TaN, TiN, or WN, is deposited over the surface. Such a barrier substantially or completely prevents both oxidation of the underlying copper, and diffusion of copper through the barrier and into the surrounding ILD during subsequent processing operations. It is preferable that the material that forms the top electrode not oxidize during a subsequent high temperature operation. Top electrode 260 may be formed from two or more layers of different materials to achieve the desired characteristics.

Bottom electrode 256, high-k dielectric layer 258, and top electrode 260, taken together, are referred to herein as a capacitor stack.

A photoresist layer 262 is then formed over top electrode 260 and patterned in accordance the design requirements of the particular integrated circuit in which it is being used. The present invention does not require that the capacitor be any particular shape. That is, the capacitor may be rectangular, polygonal, circular, or any other geometry. After the photoresist is patterned, the capacitor stack is etched, with the etch stopping on the underlying ILD 252 surface. In this way, one or more individual capacitor stacks are formed. Photoresist 262 is then chemically stripped using a resist strip which is inert with respect to Cu. An example of such a resist strip is XT1100 available from Ashland Specialty Chemical Company of Dublin, Ohio. The XT1100 is a photoresist stripper plus an N-methyl-2-pyrrolidone solvent.

In accordance with the present invention, a thin layer is then deposited over the surface of the wafer such that both the surface of ILD layer 252 and the exposed surfaces of the one or more capacitor stacks are covered. In this illustrative example, the thin layer is a silicon nitride ($Si_3N_4$) layer 264. This layer of silicon nitride 264 will subsequently act as an etch stop when vias are etched into an overlying layer of dielectric material.

After formation of nitride layer 264, an ILD layer 266 is formed over nitride layer 264. ILD 266 provides the physical and electrical separation between two levels of interconnect lines. Photoresist is deposited over ILD 266 and patterned to expose one or more regions of ILD 266 wherein via openings are to be formed. The exposed portions are then etched with the etch stopping on the underlying nitride layer 264. This via etch leaves portions of the etch stop layer exposed. Typically, via openings are formed over both the capacitor stacks and copper interconnect. After the via openings are formed, the ILD is patterned again to form the damascene trenches that will be used to form the overlying interconnect level. The exposed portions of the nitride etch stop layer are then etched, which exposes both the top electrode of the capacitor stack and portions of copper interconnect lines.

Figure 12:
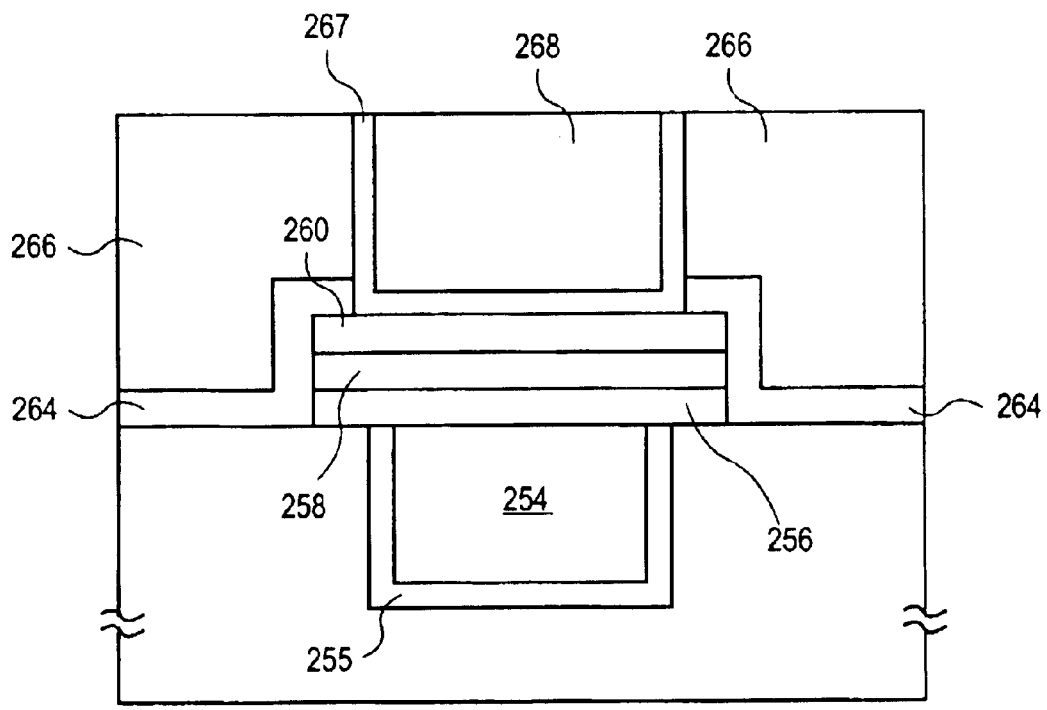
FIG. 12 is a schematic cross section of the structure of FIG. 11 after an interlayer dielectric has been formed over the capacitor stack, patterned to provide an opening therethrough, and the opening filled with conductive material.
Figure 13:
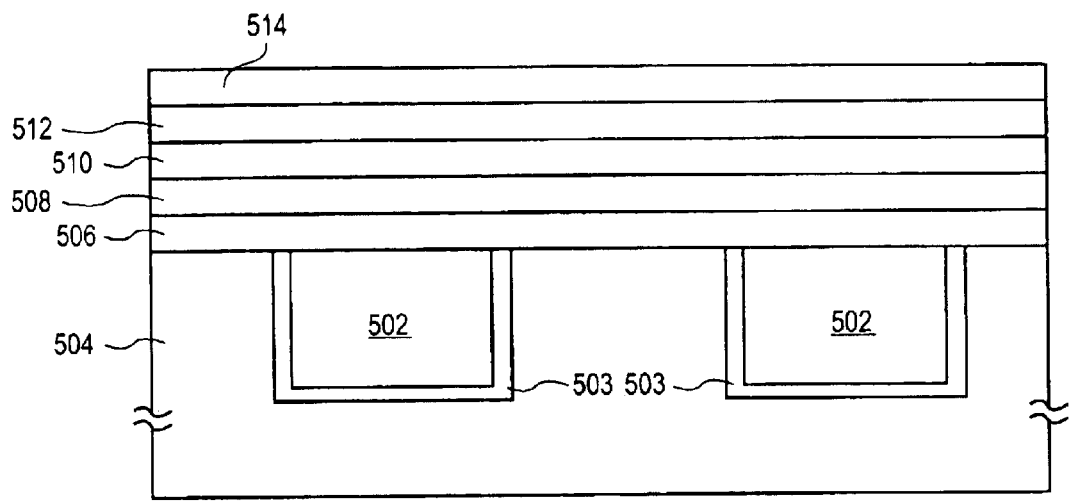
FIG. 13 is a schematic cross section of a portion of a partially processed wafer showing copper interconnect lines surrounded by intra-layer dielectric material, and a first conductive layer, a first dielectric layer, a second conductive layer, a third conductive layer, and a photoresist layer overlying the copper interconnect lines and intra-layer dielectric material.
Figure 14:
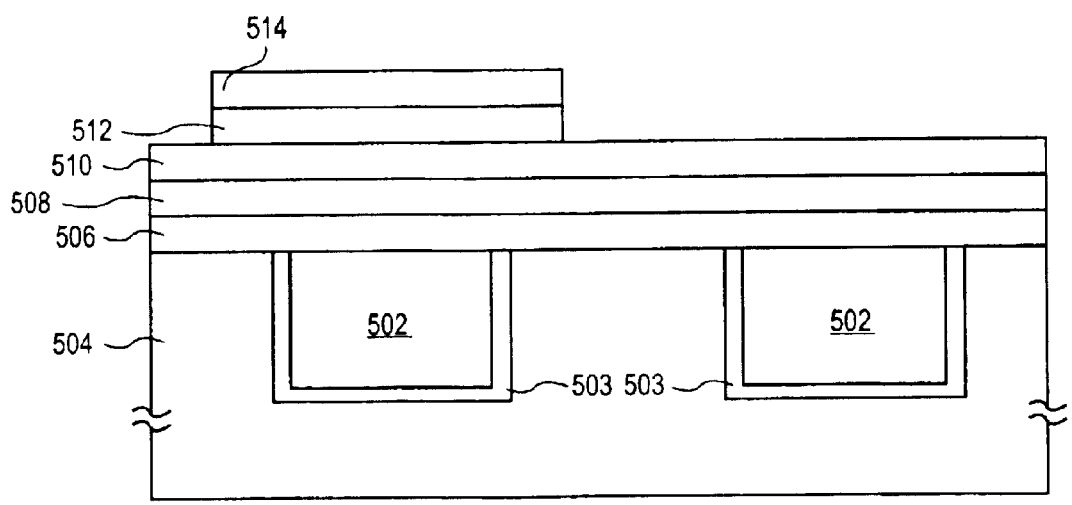
FIG. 14 is schematic cross section of the structure of FIG. 13, after the photoresist layer has been patterned and the third conductive layer has been patterned in accordance with the patterned photoresist layer.
Figure 15:
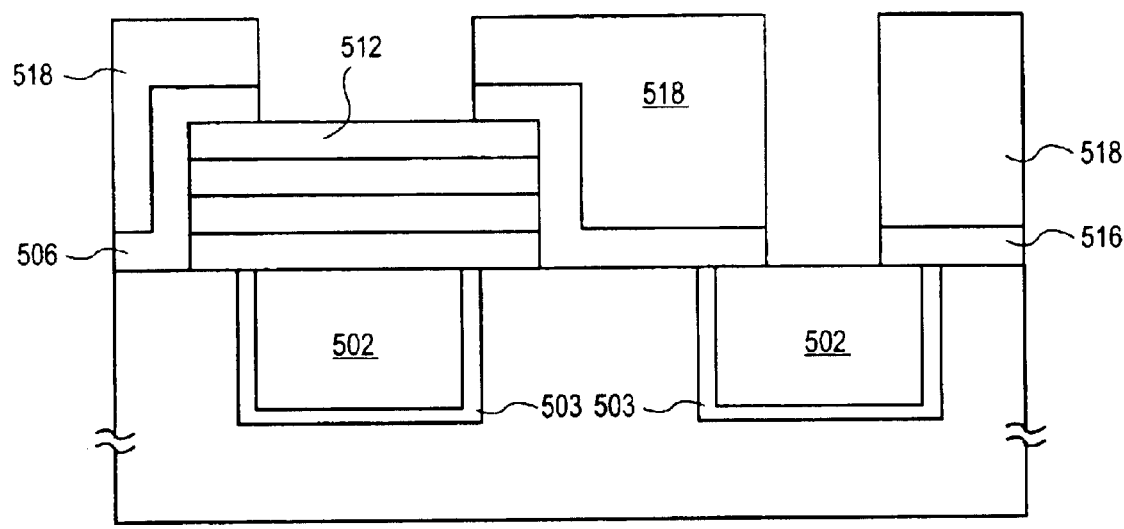
FIG. 15 is a schematic cross section of the structure of FIG. 14, after second conductive layer, the first dielectric layer, and the first conductive layer have been patterned in accordance with the patterned third conductive layer, a barrier layer has been formed adjacent and superjacent the capacitor stack, an inter-layer dielectric layer has been formed over the barrier layer, and the barrier layer and the inter-layer dielectric layer have been patterned to form an opening therethrough.
Figure 16:
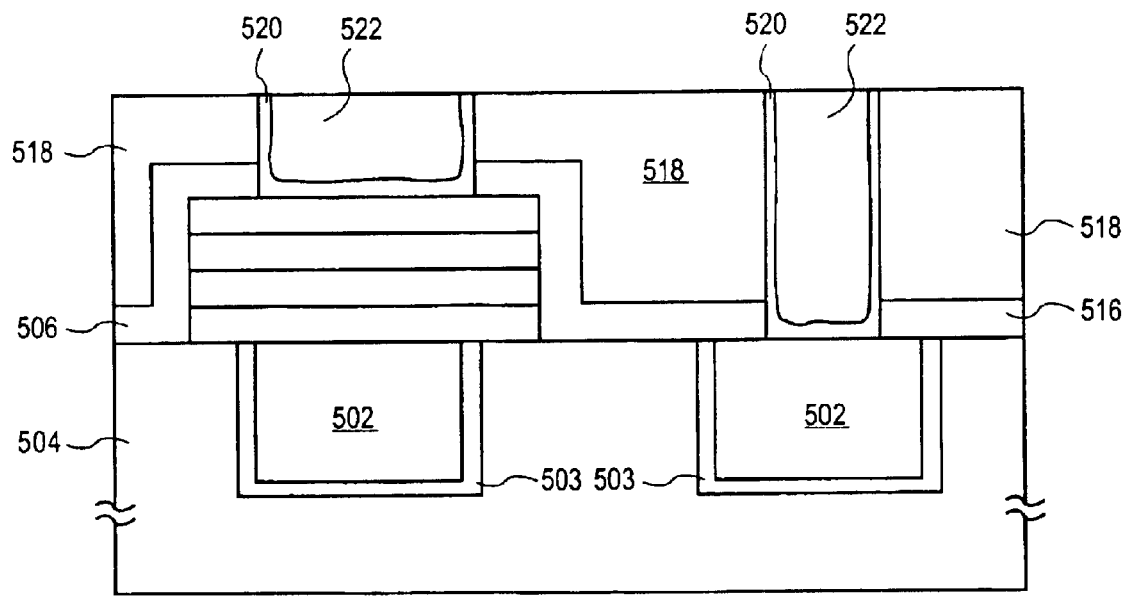
FIG. 16 is a schematic cross section of the structure of FIG. 15, after the opening has been filled with a conductive material.

The next level of Cu interconnect lines and associated vias, are formed in accordance with a damascene metallization process. For example, a barrier layer 267 and seed layer are deposited over the patterned ILD top surfaces including the trench and via openings. Cu is then plated and the excess copper is removed typically by a chemical mechanical polishing (CMP) process. Barrier layer 267 prevents the outdiffusion of copper into the surrounding dielectric material. Barrier layer 267 is typically, but not necessarily, a conductive material such as for example, tantalum or tantalum nitride. As shown in FIG. 12, copper metal 268 fills the barrier lined trench in dielectric 266 and therefore make contact with the top electrode of the capacitor stack.

In an alternative method in accordance with the invention, formation of a capacitor structure involves the use of an Al hardmask (512), as shown in FIGS. 13–16. A Cl based plasma etch can be used to define the Al with a patterned layer of photoresist thereon. The photoresist can then be removed by $O_2$ ashing as described above. A fluorine etch can then be used to define the capacitor stack using the Al as a hardmask.

Figure 17:
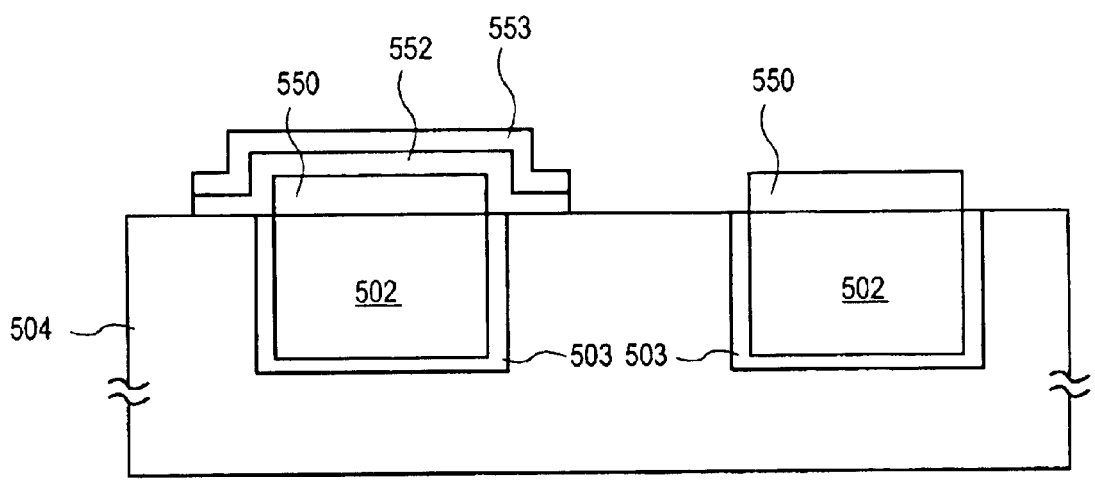
FIG. 17 is a schematic cross section of a portion of a partially processed wafer showing copper interconnect lines surrounded by intra-layer dielectric material, and a first conductive layer overlying the copper interconnect lines, but not the intra-layer dielectric, a dielectric material disposed over a portion of the first conductive layer, and a second conductive layer disposed over the dielectric material.

Referring to FIG. 17, an alternative approach is illustrated which involves selectively plating a bottom electrode (550) material onto the surface of an underlying Cu interconnect (502). An advantage of this method, is that shorting of the capacitor as a result of the etch of the bottom electrode is substantially reduced or eliminated because the bottom electrode is defined by the pattern of the underlying Cu interconnect (502). The possibility of shorting is reduced because if there is some conductive residue, or stringers from the etch, they will not short out the capacitor.

Figure 18:
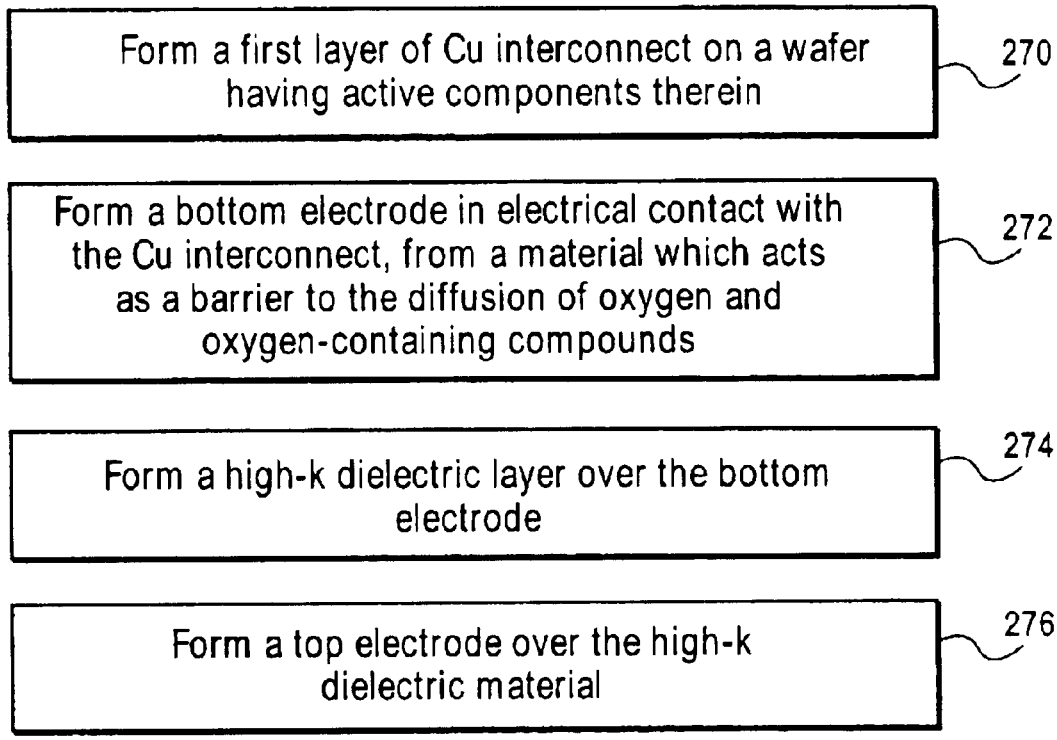
FIG. 18 is a flow diagram of a process in accordance with the present invention which forms a capacitor having a bottom electrode that acts as a barrier to both Cu diffusion and oxidation.

FIG. 18 is a flow diagram of a process, in accordance with the present invention, which forms a capacitor having a bottom electrode that acts as a barrier to both Cu diffusion and oxidation. A first layer of copper interconnect is formed (270) on a wafer in which various active components, such as transistors, have already been formed. In this illustrative example the copper interconnects are formed by way of a damascene process. Formation of copper interconnects by damascene metallization processes is known in this field and is not described in further detail herein. A bottom electrode, in electrical contact with the Cu interconnect, is formed (272) from a material which acts as a barrier to the diffusion of oxygen and oxygen-containing compounds. In addition to being a barrier to oxygen and oxygen-containing compounds, the bottom electrode preferably acts a barrier to the diffusion of copper. The bottom electrode may be formed of a single material, such as for example ruthenium, or it may be composite of two or materials to achieve the desired characteristics. A high-k dielectric layer is then formed over the bottom electrode (274), and a top electrode is formed over the high-k dielectric material (276). The formation of the high-k dielectric layer may be accomplished by the deposition of BST, tantalum pentoxide, or another suitable high-k insulating material.

Figure 19:
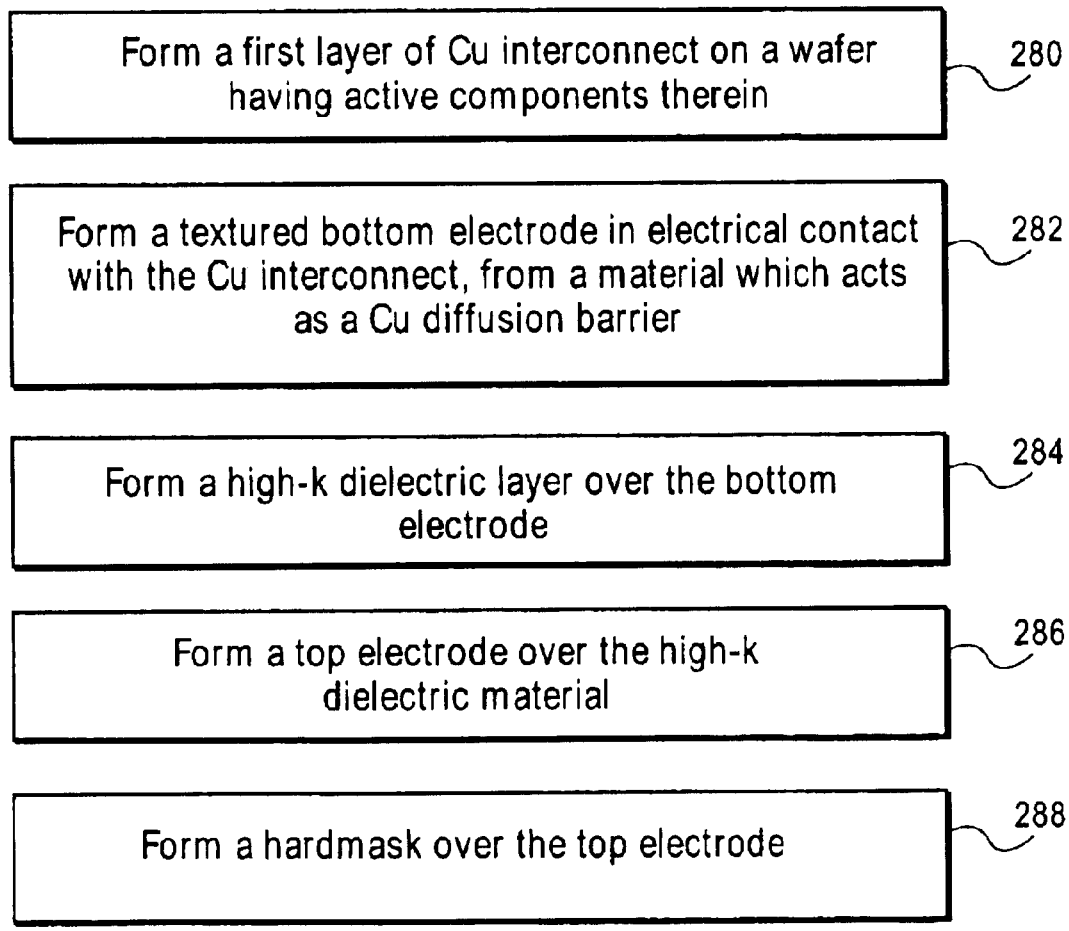
FIG. 19 is a flow diagram of a process in accordance with the present invention which forms a capacitor having a non-planar bottom electrode.

FIG. 19 is a flow diagram of a process, in accordance with the present invention, in which a capacitor having a nonplanar bottom electrode is formed. A first layer of copper interconnect is formed (280) on a wafer in which various active components, such as transistors, have already been formed. In this illustrative example the copper interconnects are formed by way of a damascene process. As noted above, formation of copper interconnects by damascene metallization processes is known in this field and is not described in further detail herein. A textured bottom electrode layer, in electrical contact with the Cu interconnect, is formed (282) from a material which acts as a Cu diffusion barrier. A high-k dielectric layer is then formed over the bottom electrode layer (284), and a top electrode layer is formed over the high-k dielectric material (286). The formation of the high-k dielectric layer may be accomplished by the deposition of BST, tantalum pentoxide, or another suitable high-k insulating material. The capacitor stack comprising the bottom electrode layer, the high-k dielectric material layer, and the top electrode layer, is patterned to form one or more individual capacitors.

Figure 20:
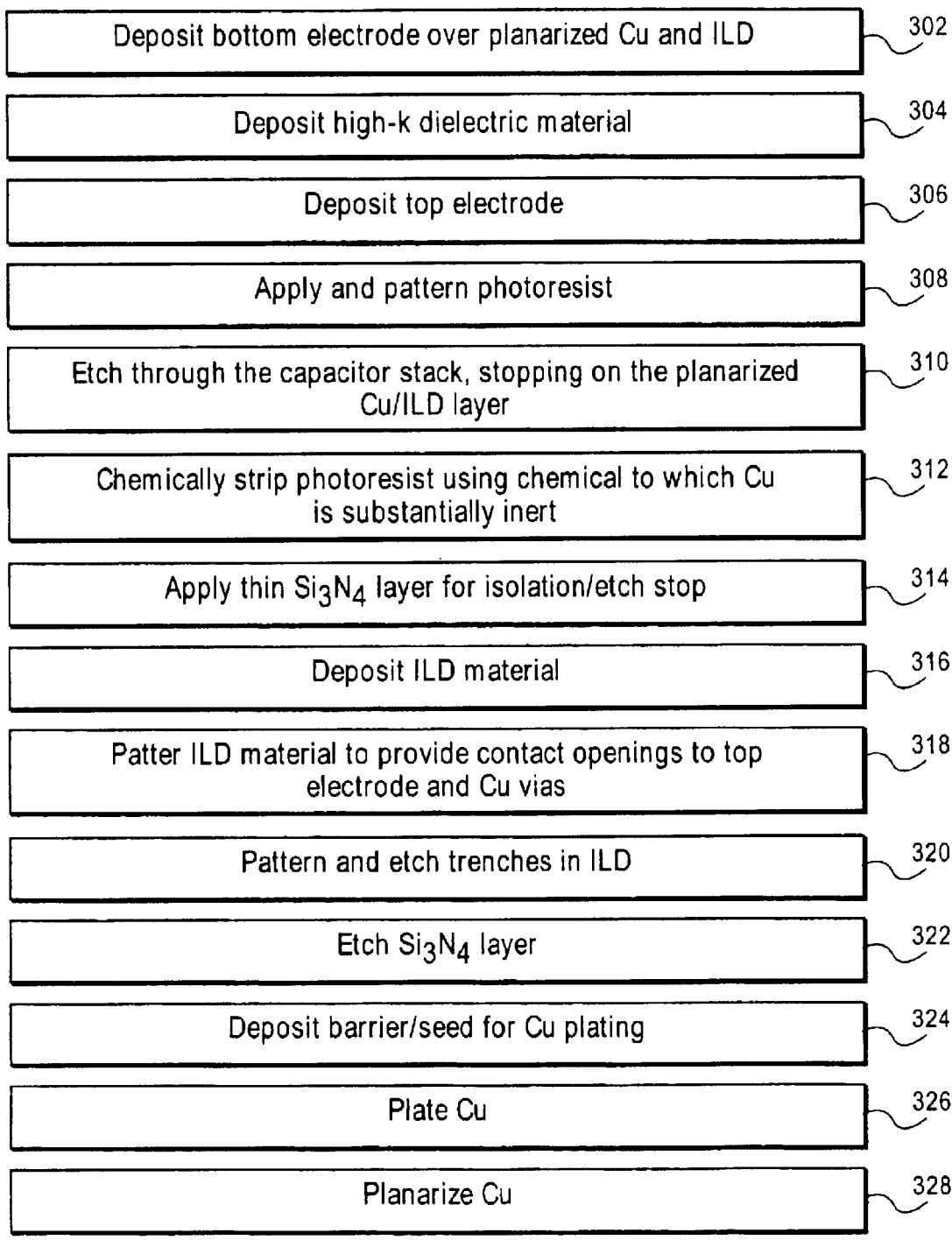
FIG. 20 is a flow diagram of a process in accordance with the present invention.

Referring to FIG. 20, a exemplary process for forming tantalum pentoxide capacitors is described. A bottom electrode is deposited (302) over a planarized (damascene) Cu and ILD. Materials including, but not limited to, TaN, TiN, and WN may be used to form the bottom electrode of the capacitor since these are conductive, block Cu diffusion into the ILD, and further block oxygen diffusion into the Cu. Prevention of oxidation and diffusion of Cu, particularly during relatively high temperature operations such as the formation of certain high-k dielectric materials is important. It should be noted that the bottom electrode of the capacitor may be formed as a single layer of material which meets the above requirements, or as a multi-layer structure having, for example an electrically conductive barrier layer disposed between the Cu interconnect and the bottom electrode of the capacitor. The bottom electrode should be compatible with the formation and adhesion of whatever high-k dielectric material is to be used in the capacitor.

Subsequent to the formation of the bottom electrode, a high-k dielectric material is deposited over the bottom electrode (304). In this illustrative embodiment the high-k material is $Ta_2O_5$. Those skilled in the art and having the benefit of this disclosure will recognize that other high-k materials may be used.

A top electrode is then deposited over the high-k dielectric (306). The top electrode is preferably a material which will not oxidize during further process operations. It is also preferable that the top electrode be made of a material that prevents diffusion of Cu during further process operations. Materials including, but not limited to, TaN, TiN, and WN may be used as the top electrode. The top electrode may be formed of one material that meets all the constraints above, or may be formed of two or more conductive materials that individually provide the required characteristics such preventing diffusion of Cu into the ILD, or diffusion of oxygen into the Cu. The bottom electrode layer, the high-k dielectric material layer, and the top electrode layer, are collectively referred to as the capacitor stack.

Photoresist is then applied over the top electrode and patterned in a conventional manner (308). The patterned photoresist protects a portion of the capacitor stack from a subsequent etch operation, while leaving another portion exposed to that subsequent etch operation.

An etch operation is then performed (310) through the capacitor stack, stopping on the underlying planarized Cu/ILD layer. That is, the exposed regions of the capacitor stack are removed, including those portions of the top electrode, high-k dielectric layer, and bottom electrode that are not protected by the patterned photoresist.

After etching the capacitor stack layers to form one or more individual capacitors, the photoresist is stripped (312). The removal of the resist is preferably accomplished with the use of a resist strip (a chemical solvent) that will not react in any significant way with the Cu interconnect metal. One such resist strip is XT1100 from Ashland Specialty Chemical Company of Dublin, Ohio. Subsequent to the resist strip operation, a thin layer of silicon nitride is formed (314) over the patterned capacitor stacks and the exposed portions of the intra-layer dielectric material. This silicon nitride layer will act as an etch stop when an overlying inter-layer dielectric is etched in order to form a connection to the top electrode of the capacitor stack. Other insulating materials may be used to form this etch stop layer as long as they provide a suitable level of selectivity with respect to the etching of the intra-layer dielectric.

An ILD material is deposited (316) over silicon nitride etch stop layer. The ILD may be formed of any suitable insulating material or combination of materials and structures, including but not limited to, silicon dioxide, carbon doped oxides of silicon, fluorine doped oxides of silicon, porous oxides of silicon, organic polymers, and the like.

The ILD material is then patterned (318), i.e., a photoresist layer is formed over the ILD, exposed, and developed, and the unprotected portions of the underlying ILD are then etched to provide openings in the ILD in alignment with the top capacitor electrodes and also to form conventional via openings to underlying interconnects. These openings may be referred to as contact openings or via openings. The end point of the ILD etch operation is achieved when the silicon nitride etch stop layer is exposed. Patterning of ILD material is well-known in this field, and is not described further herein.

The ILD material is then patterned again (320) to form damascene trenches in the ILD. The exposed portions of the silicon nitride etch stop layer are then etched (324) to expose the copper at the bottom of the via openings. Conventional steps of barrier and seed layer deposition, followed by copper electroplating (326) and removal of excess copper and barrier material by chemical mechanical polishing (328) may be used to complete the topmost layer of copper interconnect lines.

Figure 21:
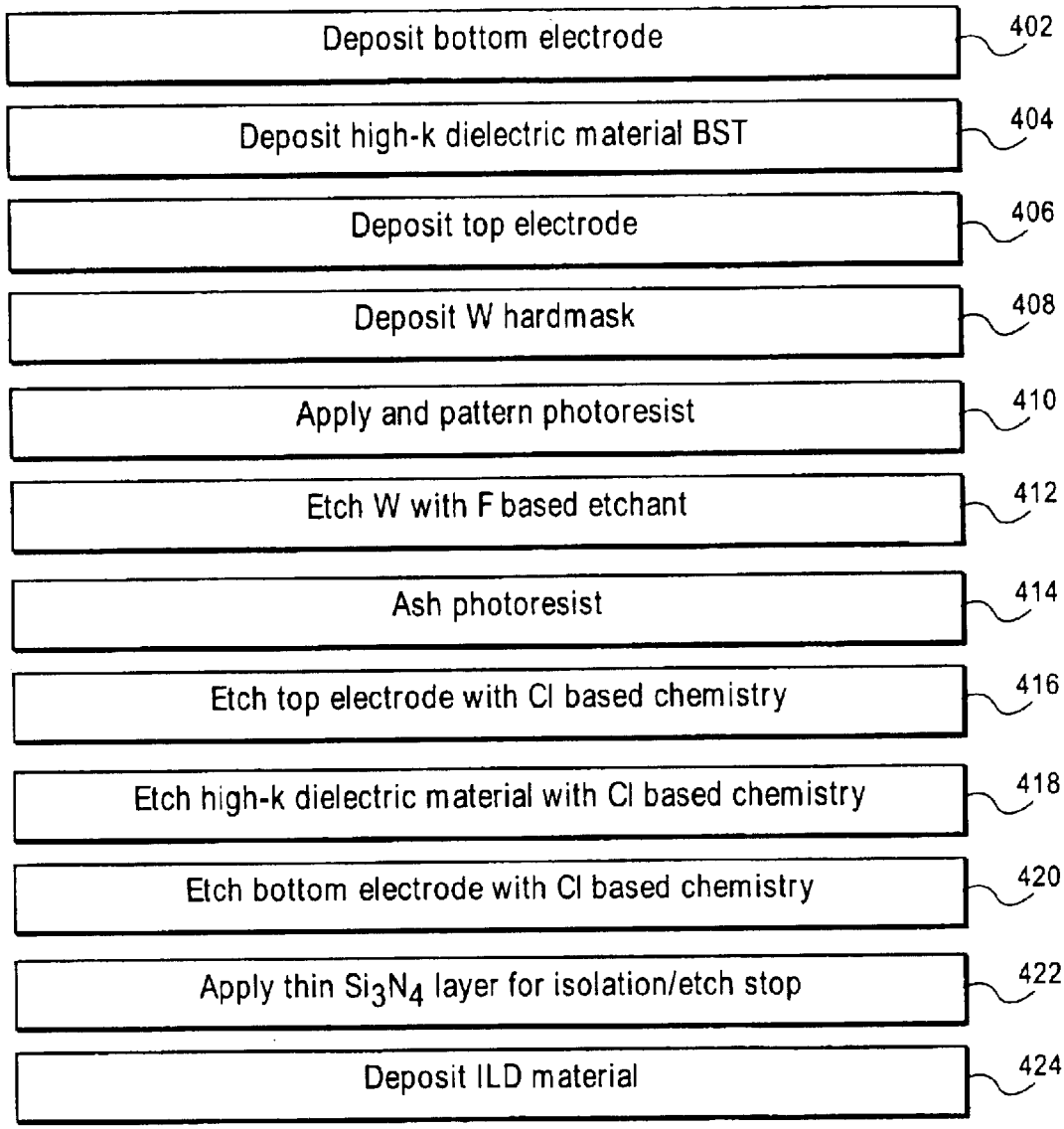
FIG. 21 is a flow diagram of a process in accordance with the present invention.

Referring to FIG. 21, a exemplary process is described in which capacitors in accordance with the present invention and having barium strontium titinate dielectric material are formed.

A bottom electrode is deposited (402) over the planarized surface of a damascene interconnect level of a partially processed wafer. The planarized surface is more specifically comprised of metal interconnect lines and an intra-layer dielectric material each having a top surface in a common plane. The bottom electrode may be a layer of a single conductive material or a combination of several conductive materials. The requirements for the bottom electrode are that it be electrically conductive, that it substantially or completely prevent the oxidation of an underlying layer of copper, and that it substantially or completely prevents the migration of copper through itself such that copper reaches into surrounding layers of material. In one embodiment the bottom electrode is a two layer stack wherein the first layer is a layer superjacent the copper and may be TiN, TaN, or WN. The second layer is a layer superjacent the first layer and may be Pt, Ir, or Ru, which are materials that will not oxidize, or react with Ba or Sr, during the high temperature deposition of BST. In fact, Ru may act as a single layer electrode since it meets the requirements described above.

Subsequent to the formation of the bottom electrode layer, a high-k dielectric material is deposited (404) over the surface of the bottom electrode layer. In this example embodiment, the high-k material is BST. In the illustrative embodiment the BST layer is an amorphous film formed by a physical vapor deposition (PVD) at a temperature less than 420° C.

The top electrode layer is then deposited (406) over the high-k dielectric material. As with the bottom electrode, the top electrode layer is preferably characterized by material properties including electrical conductivity, resistance to oxidation during subsequent processing operations, and the ability to act as a barrier to the diffusion of Cu. Pt, Ir, and Ru, are examples of conductive materials that will resist oxidation during subsequent process operations. TiN, TaN, and WN are examples of conductive materials that can act as Cu diffusion barriers. The top electrode may be formed as a multi-layer structure so as to attain the required material properties, or characteristics. However, Ru, by itself, meets all of the requirements set forth above, and may therefor be used to form a single layer top electrode.

After formation of the top electrode layer, a hardmask layer is formed over the top electrode layer (408). In the illustrative embodiment of FIG. 21, the hardmask layer is a layer of tungsten.

A photoresist layer is then formed and patterned, i.e., exposed and developed, (410) so that portions of the W hardmask layer are exposed, while other portions of the W hardmask layer remain protected by the superjacent photoresist.

Using a fluorine based etchant, the exposed portions of the tungsten hardmask layer are etched (412). This etch operation exposes the top electrode layer which is subjacent to the hardmask layer. Subsequent to the fluorine based etch operation, the photoresist is removed by ashing (414). In this way, the photoresist is ashed without exposing the underlying Cu to an oxidizing atmosphere.

Using a chlorine based etch chemistry, the exposed portions of the top electrode layer are etched (416), the high-k dielectric material is etched (418), and the bottom electrode layer is etched (420). At this point, one or more capacitor stacks (depending on the specific circuit layout configuration called for in the design of any particular integrated circuit) have been formed.

A layer of silicon nitride is then formed over the surface of the wafer including over the top and sides of the capacitor stacks (422). This layer of silicon nitride acts as a barrier to any Cu diffusion, and also acts as an etch stop layer for subsequent processing operations.

After the etch stop layer is formed over the surface of the wafer and the top and side surfaces of the capacitor stacks, a ILD material is deposited (424) over the etch stop layer.

Conventional process operations may then be applied to form overlying layers of metal interconnect lines.

Conclusion

Embodiments of the present invention provide on-chip decoupling capacitor structures and methods of fabricating these on-chip decoupling capacitors. Decoupling capacitors help reduce or prevent L di/dt voltage droop on the power grid of integrated circuits during high surge current conditions. The inclusion of the decoupling capacitor on the die directly between the power grid greatly reduces the inductance, L, and thereby provides decoupling capability for higher frequency noise.

An advantage of embodiments of the present invention is that the high capacitance is achievable without increasing the footprint of the chip or its package.

A further advantage of embodiments of the present invention is that the number of discrete components required for a system is reduced.

A still further advantage of embodiments of the present invention is that the decoupling capacitor can be placed very close to the power and ground conductors of a chip thereby reducing parasitic inductance which tends to limit the high frequency performance of decoupling capacitors.

It should be noted that although the present invention is described in terms of a structure useful for the electrical function of decoupling, that capacitors in accordance with the present invention may be used for other circuit applications.

It will be understood that various other changes in the details, materials, and arrangements of the parts and operations which have been described and illustrated herein may be made by those skilled in the art without departing from the principles and scope of the invention as expressed in the subjoined Claims.

What is claimed is:

1. A decoupling capacitor placed in between a first interconnect layer and a second interconnect layer, comprising:

a high-k dielectric material disposed between a first three dimensional electrode and a second electrode;

the first electrode comprising a first material which substantially prevents diffusion of copper therethrough, and a second material, superjacent an entire surface of the first material, which substantially prevents diffusion of oxygen and oxygen-containing compounds therethrough, an entire bottom surface of the first electrode being in physical contact with a first interconnect layer; and the second electrode comprising a third material which substantially prevents diffusion of oxygen and oxygen-containing compounds therethrough and a fourth material, superjacent an entire surface of the third material, which substantially prevents diffusion of copper therethrough, an upper surface of the second electrode being in contact with a second interconnect layer.

2. The capacitor of claim 1, wherein the first material is selected from the group consisting of TiN and TaN.

3. The capacitor of claim 1, wherein the fourth material is selected from the group consisting of TiN and TaN.

4. The capacitor of claim 1, wherein the first and second material are the same.

5. The capacitor of claim 1, wherein the second electrode further comprises a fifth material superjacent the fourth material, and the fourth and fifth materials have different etch rates in a fluorine-containing plasma.

6. The capacitor of claim 1, wherein the second electrode further comprises a fifth material superjacent the fourth material, and the fourth and fifth materials have different etch rates in a chlorine-containing plasma.

7. An integrated circuit, comprising:

a plurality of interconnected components disposed on a substrate;

a first interconnect line disposed on a first interconnect level of the substrate, and a second interconnect line disposed on a second interconnect level of the substrate;

a capacitor having a first electrode in electrical contact with the first interconnect line, and further having a second electrode in electrical contact with the second interconnect line, wherein an entire bottom surface of the first electrode being in physical contact with the first interconnect line;

the capacitor comprising a high-k dielectric material disposed between the first three dimensional electrode and the second electrode;

the first electrode comprising a first material which substantially prevents diffusion of copper therethrough, and a second material, superjacent an entire surface of the first material, which substantially prevents diffusion of oxygen and oxygen-containing compounds therethrough; and the second electrode comprising a third material which substantially prevents diffusion of oxygen and oxygen-containing compounds therethrough and a fourth material, superjacent an entire surface of the third material, which substantially prevents diffusion of copper therethrough.

8. The integrated circuit of claim 7, wherein the first and second interconnect lines comprise copper.

9. The integrated circuit of claim 8, wherein the second terminal further comprises a fifth material superjacent the fourth material.

10. The integrated circuit of claim 9, wherein the fifth material is selected from the group consisting of aluminum and tungsten.

11. The integrated circuit of claim 10, wherein the second terminal further comprises a fifth material superjacent the fourth material.

12. The integrated circuit of claim 11, wherein the fifth material is selected from the group consisting of aluminum and tungsten.

* * * * *